(12) United States Patent
Ikeda et al.

(10) Patent No.: US 6,368,729 B1
(45) Date of Patent: Apr. 9, 2002

(54) TUNGSTEN FILM, METHOD OF MANUFACTURING THE SAME, AND THIN-FILM HEATER

(75) Inventors: Tomoo Ikeda; Etsuo Yamamoto; Yoshimasa Shirai; Hiroshi Ikeda, all of Tokorozawa (JP)

(73) Assignee: Citizen Watch Co., Ltd., Tokyo (JP)

(*) Notice: Subject to any disclaimer, the term of this patent is extended or adjusted under 35 U.S.C. 154(b) by 0 days.

(21) Appl. No.: 09/670,396

(22) Filed: Sep. 27, 2000

(30) Foreign Application Priority Data

Sep. 28, 1999 (JP) .......................... 11-274873

(51) Int. Cl.[7] ........................ B32B 15/04; C23C 14/14; C23C 14/34
(52) U.S. Cl. .................... 428/665; 428/606; 204/192.1; 204/192.21
(58) Field of Search ................. 428/665, 606; 204/192.1, 192.21

(56) References Cited

U.S. PATENT DOCUMENTS 4,719,477 A * 1/1988 Hess
5,230,847 A * 7/1993 Jalby et al.
5,726,693 A * 3/1998 Sharma et al.
6,107,199 A * 8/2000 Allen et al.

* cited by examiner

*Primary Examiner*—Deborah Jones
*Assistant Examiner*—Jason L. Savage
(74) *Attorney, Agent, or Firm*—Finnegan, Henderson, Farabow, Garrett & Dunner, L.L.P.

(57) ABSTRACT

The invention provides a thin-film heater having a high heat-resisting property and a high resistivity and suitable for low power consumption and for a compact and fine structure, and a method of manufacturing this thin-film heater.

A thin-film heater contains a tungsten film formed on a substrate, and this tungsten film generates heat when a current is supplied to this tungsten film. The tungsten film is formed by an RF sputtering method, and is constructed of tungsten having peaks at approximately 36 degrees, 40 degrees and 44 degrees in Bragg angle $2\theta$ of X-ray diffraction.

19 Claims, 4 Drawing Sheets

TUNGSTEN FILM, METHOD OF MANUFACTURING THE SAME, AND THIN-FILM HEATER

BACKGROUND OF THE INVENTION

1. Field of the Invention

The present invention relates to a compact and fine thin-film heater with low power consumption, a method of manufacturing this thin-film heater, a tungsten film, and a method of manufacturing this tungsten film. Particularly, the invention relates to a thin-film heater using a tungsten film that is composed of tungsten in which both α-phase tungsten and β-phase tungsten exist, and a method of manufacturing this thin-film heater.

2. Description of Related Art

In recent years, micromachines have been extensively developed, and, along with this development, many devices have been designed with compact and fine structures. Many of these devices have heaters inside them. Recently, the heaters accommodated in these devices have been replaced by thin-film heaters that are advantageous in making these devices compact. Under these circumstances, thin-film heaters have also been required to be more compact and finer. As a device that uses a thin-film heater, a thermal printer is generally been widely known. In the field of thermal printers, research and development have also rapidly progressed to provide thin-film heaters in more compact and finer structures in order to achieve high definition printing.

When a thin-film heater is manufactured by forming a film of the heater using a material of a high heat-resisting property and a high resistivity, the thin-film film heater can be provided in a more compact and finer structure taking advantage of the characteristics of the high heat-resisting property. Further, based on the characteristic of high resistivity, the thin-film heater can secure a sufficient heating value despite having a compact and fine structure. Furthermore, the compact and fine structure makes it possible to minimize power consumption.

A Nichrome (Ni—Cr) film has been known as a thin-film heater. The Nichrome film, however, does not have a sufficiently high heat-resisting property although it has a high resistivity. Therefore, this Nichrome film has had a drawback in that it becomes disconnected when it is provided in a compact and fine structure.

SUMMARY OF THE INVENTION

In order to eliminate the above drawbacks of the conventional example, it is an object of the present invention to provide a tungsten film that has a high heat-resisting property and a high resistivity, a method of manufacturing this tungsten film, a thin-film heater, and a method of manufacturing this thin-film heater.

It is another object of the invention to provide a tungsten film that can be formed in a compact and fine structure and that has a characteristic low power consumption, a method of manufacturing this tungsten film, a thin-film heater, and a method of manufacturing this thin-film heater.

It is still another object of the invention to provide a tungsten film that has high reliability and stable characteristics, a method of manufacturing this tungsten film, a thin-film heater, and a method of manufacturing this thin-film heater.

In order to achieve the above objects, according to a first aspect of the present invention, there is provided a tungsten film which is formed by an RF sputtering method, and is composed of tungsten having peaks at approximately 36 degrees, 40 degrees and 44 degrees in Bragg angle 2θ of X-ray diffraction. Particularly, it is preferable that the tungsten film is composed of tungsten having coexisting α-phase tungsten and β-phase tungsten, and that the resistivity immediately after film-forming is within a range from 60 to 70 $\mu\Omega$cm, and the resistivity after a heat treatment is within a range from 55 to 65 $\mu\Omega$cm.

Further, according to a second aspect of the invention, there is provided a method of manufacturing a tungsten film that comprises a step of maintaining a density of residual oxygen molecules, in the atmosphere within a device, within a range from $3.54 \times 10^9$ to $1.77 \times 10^{11}$ (molecule/cm$^3$), and a step of forming the tungsten film by an RF sputtering method within the device.

Further, according to a third aspect of the invention, there is provided a thin-film heater having a tungsten film formed on a substrate, wherein the tungsten film generates heat when a current is supplied to the tungsten film. It is preferable that the tungsten film is formed by an RF sputtering method, and that the tungsten film is constructed of tungsten having peaks at approximately 36 degrees, 40 degrees and 44 degrees in Bragg angle 2θ of X-ray diffraction.

Further, according to a fourth aspect of the invention, there is provided a method of manufacturing a thin-film heater that comprises a step of setting a density of residual oxygen, within a device that carries out sputtering, to within a range from $3.54 \times 10^9$ to $1.77 \times 10^{11}$ (molecule/cm$^3$), and a step of forming a tungsten film by an RF sputtering method within the range of the density of residual oxygen. Particularly, it is preferable that the method of manufacturing a thin-film heater further comprises a step of photolithography processing for patterning a photosensitive material on the tungsten film by using a photolithography method, a step of etching processing for etching the tungsten film to the shape of the photosensitive material, and a step of detaching the photosensitive material from the tungsten film.

BRIEF DESCRIPTION OF THE DRAWINGS

The above objects and features of the present invention will be more apparent from the following description of the preferred embodiments with reference to the accompanying drawings.

DETAILED DESCRIPTION OF THE PREFERRED EMBODIMENTS

Figure 1:
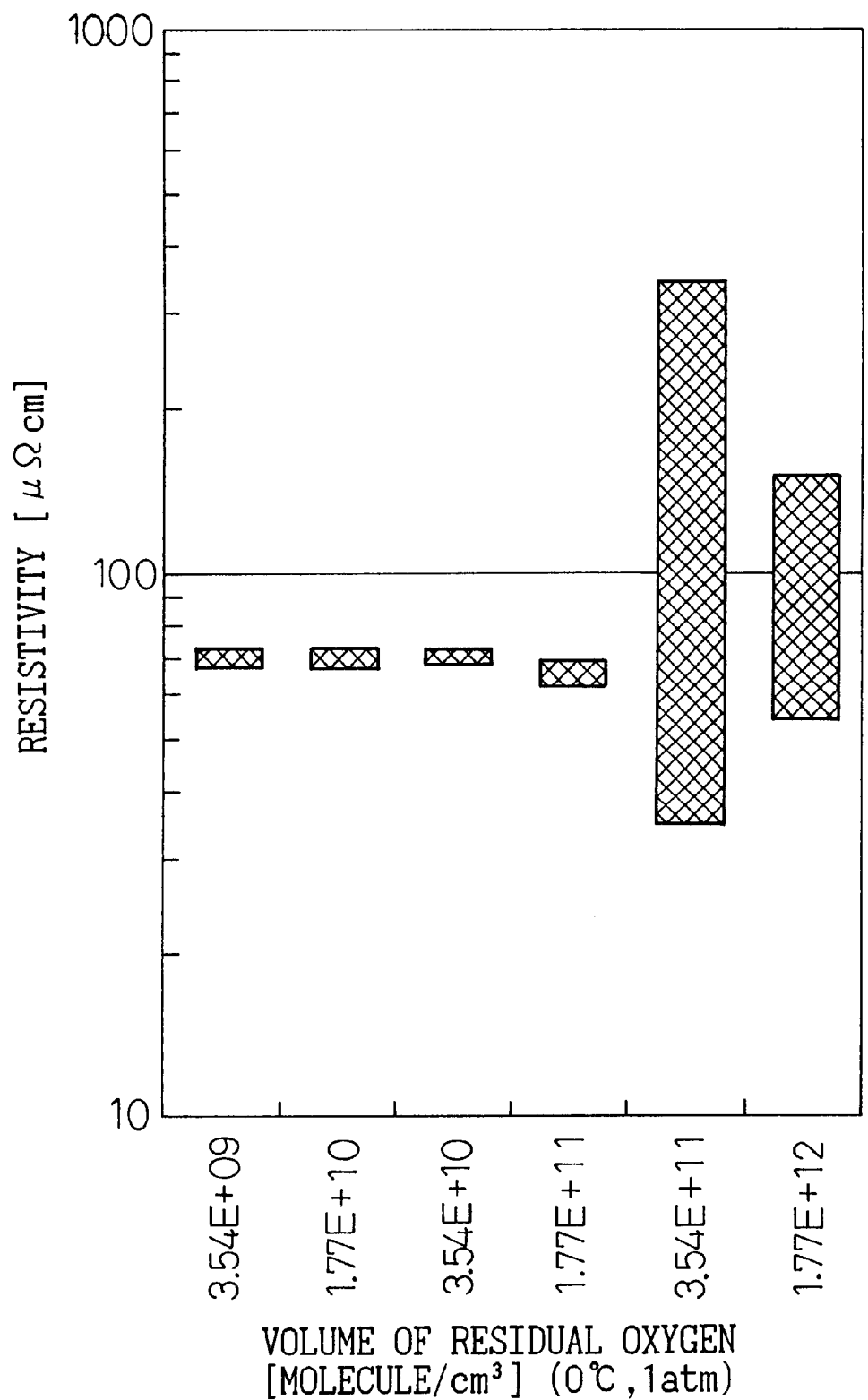
FIG. 1 is a diagram showing a relationship between a density of residual oxygen and a dispersion of a resistivity of a tungsten film.

Before describing the embodiments of the present invention, the related art and the disadvantages therein will be described with reference to the related figures.

Tungsten (W) has two states, α-phase and β-phase, based on a difference in a lattice state of a molecule. Generally, the α-phase is more stable than the β-phase. Therefore, in a bulk-shaped tungsten, most of its component is occupied by the α-phase.

Tungsten having only the α-phase has characteristics that its heat-resisting property is very high, but its resistivity is low. On the other hand, tungsten having only the β-phase has excellent characteristics in that its heat-resisting property and resistivity are both very high. For example, while the resistivity of tungsten having only the α-phase is approximately 10 $\mu\Omega$cm, the resistivity of tungsten having only the β-phase is very high and is approximately 1000 $\mu\Omega$cm.

However, in the case of a tungsten film having only the β-phase, the resistivity of this tungsten film is suddenly lowered to change its phase to the α-phase when heat has been applied to the tungsten film after forming the film. As a result, this tungsten film cannot maintain a high resistivity. Therefore, either the tungsten having only the α-phase or the tungsten having only the β-phase are not excellent materials for thin-film heaters.

However, it has been made clear that a film composed of tungsten having both an α-phase and tungsten having a β-phase has a high heat-resisting property and can maintain a high resistivity even when the tungsten film is heated after the film has been formed. For example, the resistivity of a tungsten film having both the α-phase phase and the β-phase immediately after the film has been formed is within a range from 60 to 70 $\mu\Omega$cm. Further, the resistivity of the tungsten film having both the α-phase and the β-phase that has been heat treated is still as high as 55 to 65 $\mu\Omega$cm. Once the tungsten film has been heat treated, the resistivity of this tungsten film hardly changes thereafter.

One of the characteristics of the present invention is to provide a tungsten film having both an α-phase and a β-phase to have both a high heat-resisting property and a high resistivity, a method of manufacturing this tungsten film, a thin-film heater using the tungsten film having both the α-phase and the β-phase, and a method of manufacturing this thin-film heater.

The principle of the formation of the β-phase is considered as follows. The α-phase of tungsten is in a stable state as described above. When an oxygen molecule enters the lattice state of this α-phase, the stable lattice state is distorted. As a result, the β-phase that is in a distorted lattice state is formed. It is considered that the distorted lattice state increases the resistivity.

As the volume of the oxygen molecules that enter becomes larger, the tungsten having only an α-phase changes to a tungsten having both an α-phase and a β-phase. This tungsten then changes to a tungsten having only the β-phase, which further changes to tungsten oxide. Therefore, by controlling the oxygen molecules that contributes to this change, it becomes possible to form a tungsten film that has a suitable mixture of the α-phase and the β-phase.

A change from the tungsten having only the α-phase to the tungsten having a suitable mixture of the α-phase and the β-phase is thought to occur based on a very small volume of oxygen. Therefore, instead of controlling the volume of the oxygen molecules to be supplied to a film-forming atmosphere, it becomes possible to control the volume of the oxygen molecules that contribute to the β-phase, by arranging that the density of oxygen remaining in the film-forming atmosphere becomes constant.

First, the following Experiment 1 has been carried out in order to check the density of residual oxygen that is optimum for manufacturing a tungsten film that has both the α-phase and the β-phase and that still has a sufficiently a high resistivity even when the film has been heat treated after forming the film. In other words, the optimum density of residual oxygen for manufacturing the tungsten film having the resistivity of 60 to 70 $\mu\Omega$cm immediately after the film-forming has been determined.

(Experiment 1)

In Experiment 1, a tungsten film was formed by the RF sputtering method while changing the density of residual oxygen, and the resistivity of the film was observed at different levels of density of residual oxygen.

The RF sputtering method is a kind of vacuum film-forming method. Based on an application of a high-frequency electric field, a plasma is generated in an argon (Ar) gas thereby to form a film within a film-forming chamber, called a vacuum chamber, that is kept in a high vacuum state. Generally, this film-forming method is implemented based on three processes; an exhausting process for exhausting the vacuum chamber to a high vacuum state; a pre-sputtering process for removing foreign molecules from the surface of a target by physically etching the surface of the target that becomes a base material of a film to be formed; and a film-forming process for forming the film on the target material placed on the substrate by using ionized argon.

The film-forming experiment was carried out under the following conditions. A sputtering pressure was set to 8 mtorr, an RF output was set to 300 W, and a pre-sputtering time was fixed to 20 minutes. Further, while adjusting the degree of vacuum in the exhausting process, the density of residual oxygen in the vacuum chamber before the film-forming process was changed to six levels including $3.54 \times 10^9$, $1.77 \times 10^{10}$, $3.54 \times 10^{10}$, $1.77 \times 10^{11}$, $3.54 \times 10^{11}$, and $1.77 \times 10^{12}$ (molecule/cm$^3$). Thus, a film was formed ten times, and the variance of the resistivity of each film has been checked.

When the degree of vacuum in the exhausting process is made very high in order to set the density of residual oxygen to less than $3.54 \times 10^9$ (molecule/cm$^3$), it takes too much time for this processing, which lowers the production efficiency. Therefore, the experiment was carried out within the range from $3.54 \times 10^9$ to $1.77 \times 10^{12}$ (molecule/cm$^3$) as explained above.

The results of the experiment are shown in Table 1 and FIG. 1 respectively. Referring to FIG. 1, shaded areas at various levels of the density of residual oxygen show a range of variance of the resistivity of tungsten films obtained by the film-forming carried out ten times.

The density of residual oxygen within the vacuum chamber is determined mainly by the degree of vacuum within the vacuum chamber in the exhausting process and by the pre-sputtering time in the pre-sputtering process. This is because the degree of vacuum in the exhausting process is proportional to the volume of the density of residual oxygen within the vacuum chamber, and because the oxygen molecule is generated mainly from the surface of the oxidized target material. Table 1 shows the degrees of vacuum in the exhausting process and the pre-sputtering time in the pre-sputtering process respectively for obtaining respective levels of the density of residual oxygen within the vacuum chamber.

The density of residual oxygen was calculated based on the degree of vacuum in the exhausting process, and the resistivity was measured using a four-points probe resistance measuring apparatus (made by Napson Co., Ltd.)

pre-sputtering process was fixed to 20 minutes. Further, while adjusting the degree of vacuum in the exhausting process, the density of residual oxygen in the vacuum chamber before the film-forming process was changed to six

TABLE 1

| Density of residual oxygen [molecule/cm$^3$] | Resistivity of film-formed tungsten film [$\mu\Omega$ cm] | | | | | | | | | Degree of vacuum in the exhausting process [mtorr] | Pre-sputtering time in the pre-sputtering process [min] |
|---|---|---|---|---|---|---|---|---|---|---|---|
| 3.54E+09 | 67 | 69 | 70 | 70 | 66 | 68 | 66 | 70 | 69 | 69 | 0.0001 | 20 |
| 1.77E+10 | 65 | 66 | 70 | 70 | 65 | 64 | 70 | 65 | 68 | 66 | 0.0005 | 20 |
| 3.54E+10 | 66 | 67 | 68 | 70 | 68 | 66 | 67 | 68 | 68 | 67 | 0.001 | 20 |
| 1.77E+11 | 60 | 61 | 65 | 67 | 63 | 60 | 65 | 65 | 62 | 66 | 0.005 | 20 |
| 3.54E+11 | 30 | 77 | 110 | 330 | 160 | 208 | 135 | 85 | 95 | 90 | 0.01 | 20 |
| 1.77E+12 | 50 | 60 | 90 | 135 | 95 | 100 | 140 | 70 | 98 | 110 | 0.05 | 20 |

As is apparent from Table 1 and FIG. 1, it can be seen that the density of residual oxygen that is optimum for manufacturing a tungsten film that has both the $\alpha$-phase and the $\beta$-phase and that has still sufficiently a high resistivity even when the film has been heat treated after forming the film, that is, the optimum density of residual oxygen for manufacturing the tungsten film having the resistivity of 60 to 70 $\mu\Omega$cm immediately after the film-forming, is within the range from $3.54 \times 10^9$ to $1.77 \times 10^{11}$ (molecule/cm$^3$).

When the density of residual oxygen within the vacuum chamber before the film-forming process is equal to or higher than $3.54 \times 10^{11}$ (molecule/cm$^3$), there exist both a case where a large volume of the $\beta$-phase is mixed with the $\alpha$-phase and thus a large volume of the $\beta$-phase increase the resistivily, and a case where the $\beta$-phase is suitably mixed with the $\alpha$-phase. In the former case, a large amount of the $\alpha$-phase changes to the $\beta$-phase due to the existence of the large number of oxygen molecules that enters the lattice of the $\alpha$-phase as foreign molecules. Because of the unstable existence of these two cases, it is not possible to always obtain a constant resistivity. When the mixture rate of the $\beta$-phase increases to come closer to 100%, the resistivity also increases, but this has a risk that the resistivity is suddenly lowered by the subsequent heat treatment, to a level almost equal to the resistivity of the $\alpha$-phase. When the density of residual oxygen becomes less than $3.54 \times 10^9$ (molecule/cm$^3$), the production efficiency is lowered as described above. At the same time, the volume of the oxygen molecules, mixed as foreign molecules with the $\alpha$-phase becomes smaller, and the rate of the mixture of the $\beta$-phase is lowered, which has a risk of not being able to provide a desired level of resistivity.

As explained above, it is preferable that the density of residual oxygen is within the range from $3.54 \times 10^9$ to $1.77 \times 10^{11}$ (molecule/cm$^3$). It is more preferable that the density of residual oxygen is within the range from $3.54 \times 10^9$ to $3.54 \times 10^{10}$ (pieces/cm$^3$).

It is considered that a method of manufacturing a tungsten film using the RF sputtering method is advisable as a method of satisfactorily mixing oxygen as a foreign molecule into the lattice state of the $\alpha$-phase, by controlling a very small volume of oxygen as described above. Thus, the following confirmation experiment was carried out as Experiment 2.

(Experiment 2)

The film-forming experiment as the Experiment 2 was carried out under the following conditions. A sputtering pressure was set to 8 mtorr, and a pre-sputtering time in the levels including $3.54 \times 10^9$, $1.77 \times 10^{10}$, $3.54 \times 10^{10}$, $1.77 \times 10^{11}$, $3.54 \times 10^{11}$, and $1,77 \times 10^{12}$ (molecule/cm$^3$). Thus, a film was formed four times by the RF sputtering method and the DC sputtering method respectively, and the dispersion of the resistivity of each film was checked. A result of this test is shown in Table 2. The DC sputtering method is a method using a DC electric field instead of the high-frequency electric field in the RF sputtering method.

TABLE 2

| Density of residual oxygen [molecule/cm$^3$] | Resistivity of film-formed tungsten film [$\mu\Omega$ cm] (Upper row: RF sputtering method/ Lower row: DC sputtering method) | | | |
|---|---|---|---|---|
| 3.54E+09 | 67 | 69 | 70 | 70 |
|  | 20 | 21 | 22 | 20 |
| 1.77E+10 | 65 | 66 | 70 | 70 |
|  | 22 | 21 | 23 | 22 |
| 3.54E+10 | 66 | 67 | 68 | 70 |
|  | 21 | 22 | 20 | 21 |
| 1.77E+11 | 60 | 61 | 65 | 67 |
|  | 21 | 21 | 21 | 21 |
| 3.54E+11 | 30 | 77 | 110 | 330 |
|  | 27 | 26 | 25 | 27 |
| 1.77E+12 | 50 | 60 | 90 | 135 |
|  | 30 | 31 | 30 | 30 |

As is clear from Table 2, according to the DC sputtering method, a tungsten film of a high resistivity is not obtained. In other words, according to the DC sputtering method, $\beta$-phase tungsten is not generated, and it is considered that a tungsten film having a suitable mixture of the $\alpha$-phase and the $\beta$-phase is not obtained as a result. This is because the RF discharging (plasma) based on the RF output helps the oxygen molecule enter as a foreign molecule into the lattice state of the $\alpha$-phase. A force similar to the RF discharging (plasma) does not appear in a DC sputtering method and, therefore, $\beta$-phase tungsten is not generated in the DC sputtering method.

Next, in order to confirm the film-forming state of a tungsten film, the following Experiment 3 was carried out.

(Experiment 3)

The film-forming state of a tungsten film was analyzed by an X-ray diffraction method. JDX-3500 (made by JEOL, Ltd.) is used for the X-ray analysis, and a tungsten film having dimensions of 10 mm×10 mm×0.3 $\mu$m is disposed on a sample base. The peak intensity of the Bragg's angle 2$\theta$ has been measured under the following conditions. The step angle is 0.020 degree, the measuring time at each angle is 0.50 second, the duct voltage is 40.00 kV, and the duct current is 300.00 mA. Further, the divergence slit is ¼ degree, and the light-receiving slit is 5.00 mn. A result of the measurement is shown in FIG. 2 to FIG. 5.

Figure 2:
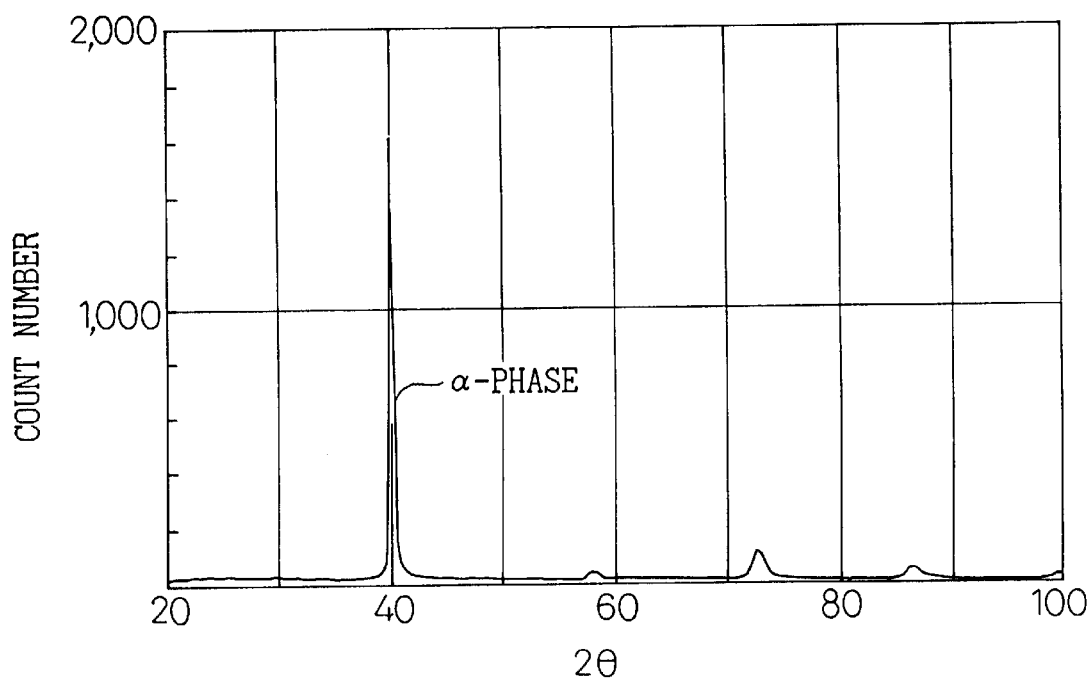
FIG. 2 is a diagram showing peak intensity of Bragg angle 2θ of a tungsten film having only an α-phase.
Figure 3:
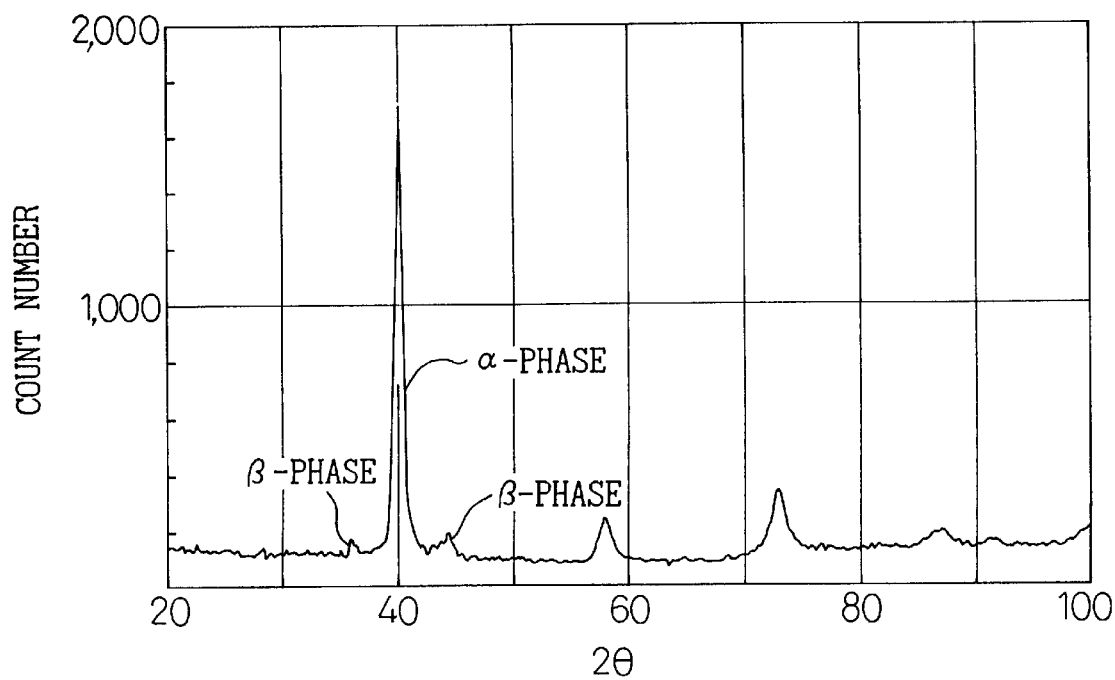
FIG. 3 is a diagram showing peak intensity of Bragg angle 2θ of a tungsten film having both an α-phase and a β-phase of which the resistivity, immediately after forming the film, is 50 $\mu\Omega$cm.
Figure 4:
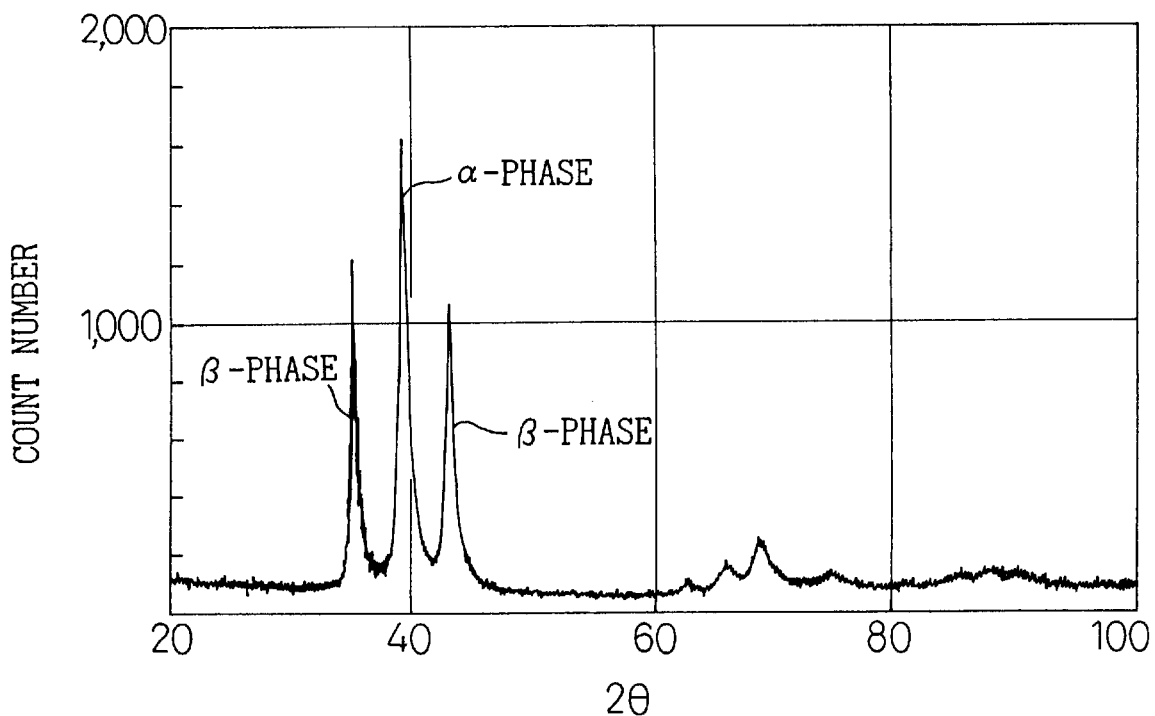
Fig. 4 is a diagram showing peak intensity of Bragg angle 2θ of a tungsten film having both an α-phase and a β-phase of which the resistivity immediately after forming is 70 $\mu\Omega$cm.
Figure 5:
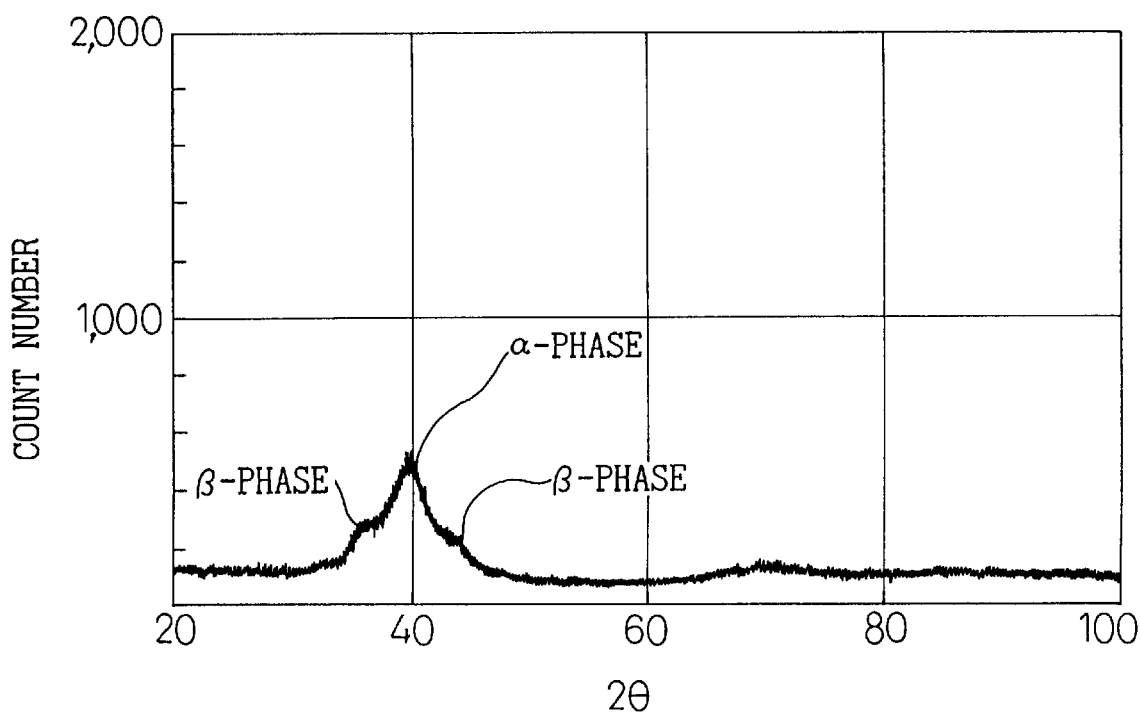
FIG. 5 is a diagram showing peak intensity of Bragg angle 2θ of a tungsten film having both an α-phase and a β-phase of which the resistivity immediately after forming is 100 $\mu\Omega$cm.

FIG. 2 shows a result of the measurement of a general tungsten film having only the α-phase. FIG. 3 is a result of the measurement of a tungsten film that has been formed based on the density of residual oxygen of $1.77 \times 10^{10}$ (molecule/cm$^3$) (resistivity 50 μΩcm). FIG. 4 is a result of the measurement of a tungsten film that has been formed based on the density of residual oxygen of $1.77 \times 10^{11}$ (molecule/cm$^3$) (resistivity 70 μΩcm). FIG. 5 is a result of the measurement of a tungsten film that has been formed based on the density of residual oxygen of $1.77 \times 10^{12}$ (molecule/cm$^3$) (resistivity 100 μΩcm).

In comparing FIG. 2 with FIG. 3 to FIG. 5 respectively, it can be understood that there exists a peak corresponding to the α-phase tungsten at approximately 40 degrees in Bragg angle 2θ of x-ray diffraction. Further, in comparing FIG. 3 to FIG. 5 with each other, it can be seen that there exists a peak corresponding to the β-phase tungsten at approximately 36 degrees and 44 degrees respectively sandwiching 40 degrees in the Bragg angle 2θ of X-ray diffraction. This is considered to be due to the entering of the oxygen molecule, as a foreign molecule, into the lattice state of the α-phase tungsten, as described above. Because of this oxygen molecule, the lattice state is distorted, and peaks are generated which are not generated in the tungsten having only the α-phase.

In the case of the tungsten film shown in FIG. 5, it is considered that the mixing rate of the β-phase has become too large, and thus, the peak at approximately 40 degrees has been superimposed with the peaks at approximately 36 degrees and 44 degrees. In the above, the "near" means a range of ± one degree.

As a result, it has been made clear that a tungsten film having coexisting α-phase tungsten and the β-phase tungsten has peaks at approximately 36 degrees, 40 degrees and 44 degrees in Bragg angle 2θ of X-ray diffraction.

From the above experiments, it can be understood that a tungsten film that has been formed by the RF sputtering and that has peaks at approximately 36 degrees, 40 degrees and 44 degrees in Bragg angle 2θ, respectively, is a tungsten film that is constructed of tungsten having coexisting α-phase tungsten and the β-phase tungsten and that also has a good heat-resisting property and a high resistivity.

(Method of Manufacturing a Thin-film Heater)

Next, a description will be made of a method of manufacturing a thin-film heater using a tungsten film that has coexisting α-phase and β-phase and that has sufficiently high resistivity even when it is heat treated after film-forming, that is, the tungsten film having the resistivity of 60 to 70 μΩcm immediately after the film-forming. This method will be explained with reference to FIG. 6(a) to FIG. 6(d).

Figure 6A:
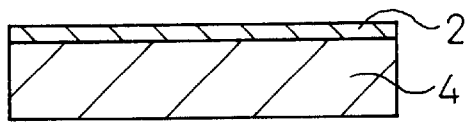
FIG. 6(*a*) is a view showing a process of forming a β-W film, FIG. 6(*b*) is a view showing a photo-lithography process, FIG. 6(*c*) is a view showing an etching process, and FIG. 6(*d*) is a view showing a detaching process.

First, a tungsten film 2 is formed on a substrate 4 to have a resistivity of 60 to 70 μΩcm immediately after the film-forming by a film-forming process as shown in FIG. 6(a). For the substrate 4, a ceramic substrate having the thermal conductivity of 0.002 cal/sec·cm·° C. (preferably less than 0.01 cal/sec·cm·° C.) has been used, and the film has been formed by the RF sputtering method.

In the film-forming process, an α-phase having a purity of 99.9% is used for the target. In the exhausting process, after the target is inserted into the vacuum chamber, the vacuum chamber is exhausted up to 50 mtorr by a rotary pump. Thereafter, a degree of vacuum of 0.001 mtorr is obtained by a cryopump.

Next, the target is pre-sputtered for 20 minutes, thereby sufficiently removing a foreign molecule from the surface of the target. Next, the target is RF sputtered by setting the sputtering pressure (argon gas pressure) to 8 mtorr, and setting the RF output to 300 W.

By carrying out the film-forming process based on the above conditions, it is possible to obtain the tungsten film 2 that has a film thickness of 0.15 μm and a resistivity of 66 μΩcm immediately after the film-forming forming and that has coexisting α-phase and the β-phase, on the substrate 4.

Figure 6B:
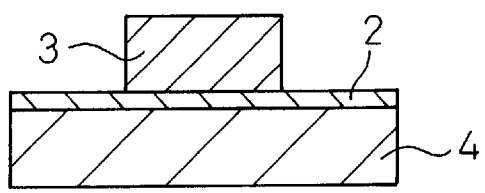

Next, as shown in FIG. 6(b), a photosensitive material layer 3 is patterned to have a desired shape of a heater by the photo-lithography method. The photo-lithography method is one of the patterning methods that is widely used in the LSI field and is most suitable for shaping a fine pattern. For the photosensitive material layer 3, a resist called AZ-P4903 (product name) manufactured by Clariant Co., Ltd. is used in this case. It is also possible to use a dry film resist instead of this material.

In the patterning process, first, AZ-P4903 is coated to have a film thickness of 10 μm on the tungsten film 2 by using a spin coating method (for 30 seconds at the rotational speed of 4,000 rpm). Next, AZ-P4903 is heat treated (for 90 seconds at 100° C.) on a hot plate, thereby evaporating the solvent in the resist. This heat treatment is also called a pre-baking process. Thereafter, AZ-P4903 is contact exposed (exposure 120 mJ/cm$^2$) to have a desired shape by using an aligner (PEM-1000) manufactured by Union Kogakusha Co., Ltd. Lastly, AZ-P4903 is developed by using a developing liquid that is exclusively used for AZ-P4903. As a result, the photosensitive material layer 3 patterned in a rectangular shape having a width of 20 μm and a length of 80 μm has been formed as shown in FIG. 6(b). Although the photosensitive material layer 3 has been patterned in a rectangular shape to have a width of 20 μm and a length of 80 μm it is also possible to make the width of this photosensitive layer 3 as small as about 5 μm.

Figure 6C:
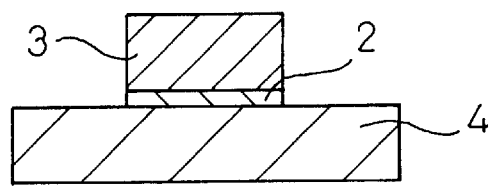

Next, the tungsten film 2 is etched in the etching process, as shown in FIG. 6(c). In the etching process, a physical etching method that is one kind of dry etching method is used. This physical etching is a method of radiating the ionized argon onto a film 2, and etching the tungsten film 2 by an ion bombardment. In this case of this method, there is no selection of the material to be etched, and all portions where the ionized argon is radiated is etched. Therefore, the photosensitive material layer 3 is also etched together with the tungsten film 2. To overcome this difficulty, it is necessary to have a sufficient thickness of the photosensitive material layer 3 to leave the photosensitive material layer 3 until the etching of the tungsten film 2 has been completed. However, this has a disadvantage in that when the thickness of the photosensitive material layer 3 is too large, it is not possible to carry out a fine patterning. Taking the above into consideration, it is preferable that the thickness of the photosensitive material layer 3 is within a range from 10 to 50 μm.

Based on the etching process using the physical etching method, the tungsten film 2 is patterned with high precision by transferring the shape of the photosensitive material layer 3 onto the tungsten film 2. As a result, it has been possible to pattern the tungsten film 2 in a rectangular shape having the width 20 μm and the length 80 μm, as shown in FIG. 6(c).

Figure 6D:
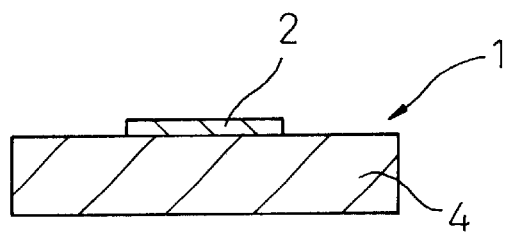

Last, the detaching processing is carried out to detach the photosensitive material layer 3 as shown in FIG. 6(d). In this case, the target is dipped into acetone to detach the photosensitive material layer 3 that has been formed using AZ-P4903, thereby completing a thin-film heater 1.

Further, in order to improve the heat-resisting property and the reliability of the thin-film heater 1, the thin-film heater 1 is heat-treated. In the heat treatment processing, the thin-film heater 1, after the detaching processing is finished, is placed in a vacuum of 0.01 mtorr, and is heated for 30 minutes at the temperature of 820° C. By this heat treatment, the resistivity of the tungsten film 2 is lowered to 61 $\mu\Omega$cm from 66 $\mu\Omega$cm at the time of the film-forming. However, once this heat treatment is carried out, it thereafter becomes possible to prevent a reduction in the resistivity of the tungsten film 2 during operation.

Although not shown in FIG. 6, a current is supplied to the tungsten film 2 from a general power source apparatus through a general wiring or the like, and the tungsten film itself is heated to function as a thin-film heater.

The thin-film heater and the method of manufacturing this thin-film heater according to the present invention can be applied to a wide range of devices other than to the thermal head of a printer. For example, it is also possible to apply the thin-film heater and the method of manufacturing this thin-film heater to an electron discharge source that is used for an analyzing device or a display unit, for example.

As explained above, according to the thin-film heater relating to the present invention, the thin-film heater is formed of tungsten having coexisting $\alpha$-phase and $\beta$-phase that is a material having a high heat-resisting property and a high resistivity. Therefore, it has become possible to make the thin-film heater in a compact and fine structure based on the characteristics of the high heat-resisting property. Further, there is an effect that, based on the characteristics of high resistivity, the thin-film heater can maintain a sufficient volume of heat generation even if the thin-film heater is formed in a compact and fine structure. Furthermore, there is an effect that it is possible to suppress power consumption of the thin-film heater because of the compact and fine structure.

Further, according to the method of manufacturing a thin-film heater relating to the present invention, it becomes possible to form a tungsten film in a fine pattern, which makes it possible to provide the thin-film heater in a more compact and finer structure than the conventional thin-film heater. Conventionally, the provision of a thin-film heater in a compact and fine structure has had a problem in the aspect of the heat-resisting property. However, according to the present invention, as the thin-film heater uses a tungsten film that has coexisting $\alpha$-phase and $\beta$-phase as a material having high heat-resisting property and a high resistivity, such a problem as observed in the conventional thin-film heater does not easily occur.

Furthermore, according to the method of manufacturing a thin-film heater relating to the present invention, the density of residual oxygen in the film-forming forming atmosphere is adjusted, which makes it possible to form a tungsten film having stable coexisting $\alpha$-phase and $\beta$-phase.

What is claimed is:

1. A tungsten film which is formed by an RF sputtering method, and is composed of tungsten having peaks at approximately 36 degrees, 40 degrees and 44 degrees in Bragg angle 2θ of X-ray diffraction.

2. The tungsten film according to claim 1, wherein the tungsten contains coexisting $\alpha$-phase tungsten and $\beta$-phase tungsten.

3. The tungsten film according to claim 2, wherein the resistivity of the tungsten film immediately after a film-forming is within a range from 60 to 70 $\mu\Omega$cm.

4. The tungsten film according to claim 3, wherein the resistivity of the tungsten film after a heat treatment is within a range from 55 to 65 $\mu\Omega$cm.

5. A thin-film heater having a tungsten film formed on a substrate, said tungsten film generating heat when a current is supplied to the tungsten film, wherein
the tungsten film is formed by an RF sputtering method, and the tungsten film is constructed of tungsten having peaks in near 36 degrees, 40 degrees and 44 degrees of Bragg's angle 2θ.

6. The thin-film heater according to claim 5, wherein the tungsten film contains coexisting $\alpha$-phase tungsten and $\beta$-phase tungsten.

7. The thin-film heater according to claim 6, wherein the resistivity of the tungsten film immediately after the film-forming is within a range from 60 to 70 $\mu\Omega$cm.

8. The thin-film heater according to claim 7, wherein the resistivity of the tungsten film after a heat treatment is within a range from 55 to 65 $\mu\Omega$cm.

9. A method of manufacturing a tungsten film comprising the steps of:
maintaining the density of residual oxygen molecules, in the atmosphere within a device, within a range from $3.54 \times 10^9$ to $1.77 \times 10^{11}$ (molecule/cm$^3$); and
forming the tungsten film by an RF sputtering method within the device.

10. The method of manufacturing a tungsten film according to claim 9, wherein the density of residual oxygen is within a range from $3.54 \times 10^9$ to $3.54 \times 10^{10}$ (molecule/cm$^3$).

11. The method of manufacturing a tungsten film according to claim 10, wherein the tungsten film contains coexisting $\alpha$-phase tungsten and $\beta$-phase tungsten.

12. The method of manufacturing a tungsten film according to claim 11, wherein the resistivity of the tungsten film immediately after the film-forming process is within a range from 60 to 70 $\mu\Omega$cm.

13. The method of manufacturing a tungsten film according to claim 12, wherein the resistivity of the tungsten film after a heat treatment is within a range from 55 to 65 $\mu\Omega$cm.

14. A method of manufacturing a thin-film heater having a tungsten film formed on a substrate, said tungsten film generating heat when a current is supplied to the tungsten film, the manufacturing method comprising the steps of:
maintaining the density of residual oxygen molecules, in the atmosphere within a device, within a range from $3.54 \times 10^9$ to $1.77 \times 10^{11}$ (molecule/cm$^3$); and
forming the tungsten film by an RF sputtering method within the device.

15. The method of manufacturing a thin-film heater according to claim 14, wherein the density of residual oxygen is within a range from $3.54 \times 10^9$ to $3.54 \times 10^{10}$ (molecule/cm$^3$).

16. The method of manufacturing a thin-film heater according to claim 15, further comprising the steps of:
a photo-lithography process for patterning a photosensitive material on the tungsten film by using a photo-lithography method;
an etching processing for etching the tungsten film to be a same shape as a pattern of the photosensitive material; and a detaching process for detaching the photosensitive material from the tungsten film.

17. The method of manufacturing a thin-film heater according to claim 16, wherein the tungsten film is constructed of tungsten containing coexisting α-phase tungsten and β-phase tungsten.

18. The method of manufacturing a thin-film heater according to claim 17, wherein the resistivity of the tungsten film immediately after the film-forming processing is within a range from 60 to 70 $\mu\Omega$cm.

19. The method of manufacturing a thin-film heater according to claim 18, wherein the resistivity of the tungsten film after heat treatment is within a range from 55 to 65 $\mu\Omega$cm.

* * * * *